(12) United States Patent
Hegde et al.

(10) Patent No.: US 7,206,363 B2
(45) Date of Patent: Apr. 17, 2007

(54) METHOD AND APPARATUS FOR DELAYED RECURSION DECODER

(75) Inventors: Rajamohana Hegde, Champaign, IL (US); Andrew Singer, Champaign, IL (US); Jacob Janovetz, Champaign, IL (US)

(73) Assignee: Intersymbol Communications, Inc., Champaign, IL (US)

( * ) Notice: Subject to any disclaimer, the term of this patent is extended or adjusted under 35 U.S.C. 154(b) by 536 days.

(21) Appl. No.: 10/603,388

(22) Filed: Jun. 24, 2003

(65) Prior Publication Data

US 2004/0264555 A1    Dec. 30, 2004

(51) Int. Cl.
*H03D 1/00*      (2006.01)
*H03M 13/41*    (2006.01)

(52) U.S. Cl. .................. 375/341; 375/262; 714/794; 714/795

(58) Field of Classification Search ................ 375/341, 375/262; 714/794, 795, 796
See application file for complete search history.

(56) References Cited

U.S. PATENT DOCUMENTS

| | | | | |
|---|---|---|---|---|
| 6,070,263 | A | * | 5/2000 | Tsui et al. .................... 714/795 |
| 6,161,210 | A | * | 12/2000 | Chen et al. ................... 714/786 |
| 7,117,426 | B2 | | 10/2006 | Wu |
| 7,127,664 | B2 | | 10/2006 | Nicol |
| 7,131,055 | B2 | | 10/2006 | Mathew |
| 2001/0035994 | A1 | | 11/2001 | Agazzi et al. |
| 2001/0035997 | A1 | | 11/2001 | Agazzi |
| 2002/0012152 | A1 | | 1/2002 | Agazzi et al. |
| 2002/0060827 | A1 | | 5/2002 | Agazzi |
| 2002/0080898 | A1 | | 6/2002 | Agazzi et al. |

OTHER PUBLICATIONS

Raghupathy and Liu,"A transformation for computational latency reduction in turbo-MAP decoding", Proceedings of the 1999 IEEE International Symposium on Circuits and Systems, 1999, ISCAS '99, vol. 4, May 30-Jun. 2, 1999 pp. 402-405 vol. 4.*
Forney, G.D., Jr., "The Viterbi algorithm" Proceedings of the IEEE vol. 61, Issue 3, Mar. 1973 pp. 268-278.*
Lee, Edward A., Messerschmitt David G., *Digital Communication-Second Edition*, pp. 406-409.
Sieben, Mike, Conradi, Jan, Dodds, David E., *Optical Single Sideband Transmission at 10 Gb/s Using Only Electrical Dispersion Compensation*, Journal of Lightwave Technology, vol. 17 No. 10, pp. 1742-1749, Oct. 1999.

(Continued)

*Primary Examiner*—Temesghen Ghebretinsae
*Assistant Examiner*—Juan Alberto Torres
(74) *Attorney, Agent, or Firm*—McDonnell Boehnen Hulbert & Berghoff LLP

(57) ABSTRACT

A high-speed maximum likelihood sequence estimation method and device. The method includes identifying candidate paths through a state trellis based on a group of observed data, where each candidate path corresponds to a best path through a trellis beginning at one of a possible prior states (and corresponding prior data bit or bits), and then selecting one of the paths based on candidate sequence selection information, typically prior state decisions (e.g., data symbols in the form of one or more bits). The path selection, in turn, provides decoding of symbols and data bit information for use in selecting one of the candidate paths in a subsequent stage.

27 Claims, 10 Drawing Sheets

OTHER PUBLICATIONS

Haykin, Simon S., *Adaptive Filter Theory*, pp. 8-10, 1986.

Kim, Kyoung, Powers, Edward J., *A Digital Method of Modeling Quadratically Nonlinear Systems with a General Random Input*, IEEE Transactions on Acoustics, Speech, and Signal Processing, vol. 36, No. 11, pp. 1758-1769, Nov. 1988.

Shanbhag, Naresh R., *Algorithms Transformation Techniques for Low-Power Wireless VLSI Systems Design*, pp. 1-36.

Fettweis, Gerhard, Meyr Heinrich, *High-Speed Parallel Viterbi Decoding: Algorithm and VLSI-Architecture*, IEEE Communications Magazine, pp. 46-55, May 1991.

Parhi K. Keshab, *Pipelining and Parallel Processing*, pp. 63-64 & 70-73, 1999.

Haunstein, Sticht K., *Design of Near Optimum Electrical Equalizers for Optical Transmissions in the Presence of PMD*.

Bulow, Henning, Thielecke, Tunther, *Electronic PMD Mitigation-From Linear Equalization to Maximum-Likelihood Detection*.

Boo, Montse, Arguello, Francisco, Bruguera, Javier D., Doallo Ramon, *High-Performance VLSI Architecture for the Viterbi Algorithm*, IEEE Transactions on Communications, vol. 45, No. 2, pp. 168-176, Feb. 1997.

Fettweis, Gerhard, Meyer, Heinrich, *Parallel Viterbi Algorithm Implementation: Breaking the ACS-Bottleneck*, IEEE Transactions on Communications, vol. 37, No. 8, pp. 785-790, Aug. 1989.

Tzou, Kou-Hu, Dunham, James G., *Sliding Block Decoding of Convolutional Codes*, IEEE Transactions on Communications, vol. Com-29, No. 9, pp. 1401-1403, Sep. 1981.

Robertson, Patrick, Hoeher, Peter, *Optimal and Sub-Optimal Maximum a Posteriori Algorithms Suitable for Turbo Decoding*, ETT vol. 8, pp. 119-125, Mar.-Apr. 1997.

Black, Peter J., Meng, Teresa H., *A 140-Mb/s, 32-State, Radix-4 Viterbi Decoder*, IEEE Journal of Solid-State Circuits, vol. 27, No. 12, pp. 1877-1885, Dec. 1992.

Black, Peter J., Meng, Teresa H., *A 1-Gb/s, Four-State, Sliding Block Viterbi Decoder*, IEEE Journal of Solid-State Circuits, vol. 32, No. 6, pp. 797-805, Jun. 1997.

Fettweis, Gerhard, Meyr, Heinrich, *High-Rate Viterbi Processor: A Systolic Array Solution*, IEEE Journal on Selected Areas in Communications, vol. 8, No. 8, pp. 1520-1534, Oct. 1990.

A. K. Yeung and J. M. Rabaey, *A 210Mb/s Radix-4 Bit-level Pipelined Viterbi Decoder*, ISSCC, 1995. pp. 88-89.

Fettweis, Gerhard, Karabed, Razmik, Siegel, Paul H., Thapar, Hemant K., *Reduced-complexity Viterbi detector architectures for partial response signaling*, IEEE Global Telecommunications Conference, Singapore, Technical Program Conference Record, vol. 1, pp. 559-563, Nov. 1995.

T.Conway, *Implementation of High Speed Viterbi Detectors*, Electronics Letters, 35(24):2089-2090, Nov. 25. 1999.

C. B. Shung, P. H. Siegel, G. Ungerboeck and H. K. Thapar, *VLSI architectures for metric normalization in the Viterbi algorithm*, in Proc. Int. Conf. Communications, vol. 4, Apr. 1990, pp. 1723-1728.

Hekstra, Andries P., *An Alternative to Metric Rescaling in Viterbi Decoders*, IEEE Transactions On Communications, vol. 37, No. 11, pp. 1220-1222, Nov. 1989.

Erik Paaske and Jakob Dahl Andersen, "High Speed Viterbi Decoder Architecture",—First ESA Workshop on Tracking, Telemetry and Command Systems, ESTEC, Jun. 1998, pp. 1-8.

Chinnery, D. G., and Keutzer, K., "Achieving 550 MHz in an ASIC Methodology", Proceedings of the 38th Design Automation Conference, Las Vegas, NV, pp. 420-425, Jun. 2001.

McGinty, Nigel C.; Kennedy, Rodney A.; and Hoeher, Peter, "Equalization of Sparse ISI Channels Using Parallel Trellises", Proceedings, GLOBECOM '98, Nov. 1998, pp. 1-6.

Liu, K. J. Ray and Raghupathy, Arun, "Algorithm-Based Low-Power and High-Performance Multimedia Signal Processing", Proceedings of the IEEE, vol. 86, No. 6, Jun. 1998.

Kang, Inyup and Willson, Alan N. Jr., "Low-Power Viterbi Decoder for CDMA Mobile Terminals", IEEE Journal of Solid-State Circuits, vol. 33, No. 3, Mar. 1998.

Furuya, Yukitsuna; Akashi, Fumio and Murakami, Shuji, "A Practical Approach Towerad Maximum Likelihood Sequence Estimation for Band-Limited Nonlinear Channels", IEEE Transactions on Communications, vol. Com-31, No. 2, Feb. 1983.

Summerfield, S., "Analysis of Convolutional Encoders and Synthesis of Rate-2/n Viterbi Decoders", IEEE Transaction on Information Theory, vol. 42, No. 4, p. 1280, Jul. 1996, pp. 1-15.

Choi, Young-bae, "A VLSI Architecture for High Speed and Variable Code Rate Viterbi Decoder" ICSPAT, Proceedings, pp. 1918-1922, 2000.

Reeve, J.S., "A Parallel Viterbi Decoding Algorithm", Jul. 21, 2000.

Gross, Warren J.; Gaudet, Vincent C. and Gulak, P. Glenn, "Difference Metric Soft-Output Detection: Architecture and Implementation", IEEE Transactions on Circuits and Systems II (Analog and Digital Signal Processing), vol. 48, No. 10, pp. 904-911, Oct. 2001, pp. 1-8.

Ranpara, Samirkumar, "A Low-Power Viterbi Decoder Design for Wireless Communications Applications", Int. ASIC Conference, Sep. 1999, pp. 1-5.

Boo, M.; Arguello, F. ; Bruguera, J.D.; and Zapata, E.L., "High-Speed Viterbi Decoder: An Efficient Scheduling Method to Exploit the Pipelining", IEEE Int'l. Aug. 19-21, 1996.

Chinnery, David, Nikolic, Borivoje and Keutzer, Kurt, "Achieving 550 MHz in an ASIC Methodology", Presentation, Proceedings of the 38th Design Automation Conference, Las Vegas, NV, pp. 420-425, Jun. 2001, PP presentation pp. 1-34 Power Point.

Winters, Jack H., "Electrical Signal Processing Techniques in Long-Haul Fiber-Optic Systems," IEEE Transactions of Communication, vol. 38, No. 9, Sep. 1990, pp. 1439-1453, in particular pp. 1445-1446.

Bahl, L.R., et al., "Optimal Decoding of Linear Codes for Minimizing Symbol Error Rate," IEEE Transaction on Information Theory, Mar. 1974, pp. 284-287.

\* cited by examiner

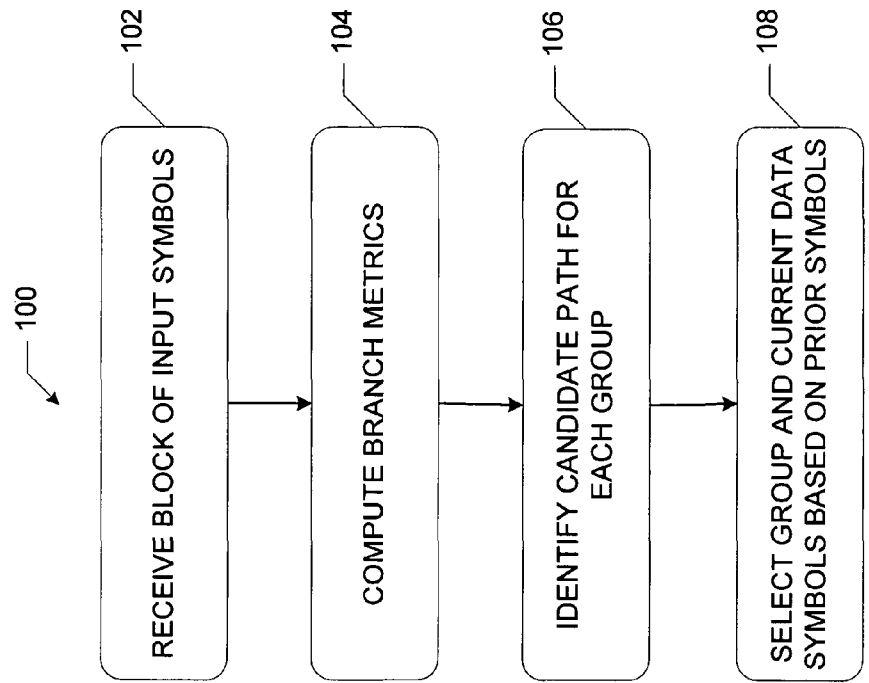
FIGURE 5
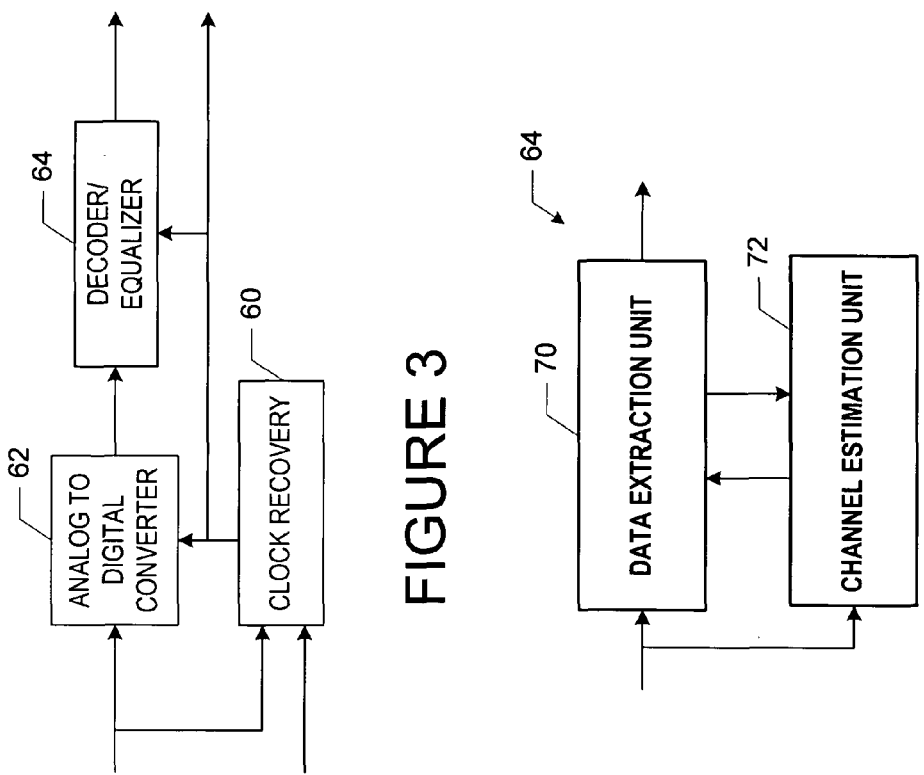
FIGURE 3
FIGURE 4

METHOD AND APPARATUS FOR DELAYED RECURSION DECODER

BACKGROUND OF THE INVENTION

A. Field of the Invention

The present invention relates to signal processing devices and methods. More specifically, it is directed to a method and device for performing maximum likelihood estimation. The invention may be used to perform signal decoding or equalization, typically in the context of data transmission systems or data storage systems utilizing communication channels.

B. Description of the Related Art

Error correction codes are widely used in communication systems to improve their performance by adding redundancy to the information to be transmitted. When received at the other end of the communication channel, the redundancy of the encoded information provides a mechanism to correct errors that may have occurred as a result of noise and distortion within the channel.

One class of codes is known as convolutional codes. Convolutional codes are formed by convolving an input symbol stream, typically made up of an integer number of binary bits k, with a generator polynomial that defines the code. The code is typically analyzed in terms of the state transitions of the encoder that occur in response to the input bits. The time sequence of allowable state transitions may then be diagramed in the form of a trellis, as shown in FIG. 1. In FIG. 1, the states are shown on the left side as (00), (01), (10), and (11), and the time index in terms of n is shown along the bottom. Each state transition from a first state to a possible next state is a branch of the trellis, and has an associated output symbol. It is well understood in the art that the sequence of possible state transitions through the trellis is referred to as a "path" through the trellis. The output symbols are then transmitted over a communication path.

At the receiver of a communication system, the encoded output symbols are analyzed to determine the most likely path through the trellis that generated the symbols, and the input bits may then be determined. One common and well-known algorithm to determine the trellis path is the Viterbi algorithm, initially proposed by A. J. Viterbi in "Error bounds for convolution codes and an asymptotically optimal decoding algorithm." IEEE Transactions on Information Theory, 13:260–269 (1967).

The Viterbi algorithm operates by examining the possible paths to each node at a given time index based on the received symbol, then selecting the most likely path to each node. In the trellis of FIG. 1, each state or node has two paths entering it. The selection is based on a branch metric. That is, for each branch of the trellis, an associated branch metric is determined that provides a measure of how close the received symbol was to the symbol associated with that particular trellis transition. The branch metric is added to the accumulated total metric for the starting node. At each node of the next state, the summed metrics of the paths entering a given state are compared, and the path having the smallest cumulative error is selected. The determination of surviving paths is thus referred to as an "add-compare-select" process, and is well known in the art. The surviving paths are then extended to the next time index, and the most likely path to each node is again selected in the same manner. If the number of errors is within the code's error correcting ability, the surviving paths will eventually merge at the earliest time indices, thereby determining the most likely path.

There are many variations to the Viterbi algorithm, and many ways to implement the algorithms in a VLSI architecture. One variation is described in the article by M. Bóo, F. Argüello, J. D. Bruguera, R. Doallo and E. L. Zapata, entitled "High-Performance VLSI Architecture for the Viterbi Algorithm" IEEE Transactions on Communications. Vol. 45. No. 2. Pages 168–176. (1997).

One technique of implementing the Viterbi algorithm using a parallel structure is to consider blocks of state transitions over a period of time (say N state transitions) and collapse each block into a single transition. That is, each block is analyzed independently, and the best paths from each initial state to each of the possible end states may be determined for each block. Each of the four initial states ((00), (10), (01), (11)) at time n−2 has four possible paths to each possible terminating state at time n+2. For each initial state, the best path to each terminating state is identified, and these paths represent the path metrics for the branches in the new compacted trellis. FIG. 1B provides an example of a collapsed trellis.

Each of the blocks of state transitions can be operated on in parallel, each one serving to reduce N transitions to a single transition in the collapsed trellis. The original trellis is thereby collapsed by a factor of N, providing a significantly reduced trellis. The reduced or collapsed trellis may then be traversed using the standard Viterbi process of determining surviving paths to each node by the add-compare-select process described above. There are numerous algorithms in the prior art that utilize various optimization techniques to provide particularly efficient structures to collapse a trellis code.

One significant disadvantage of the existing parallel Viterbi structures is that the parallel structure still provides a trellis that must be navigated using the add-compare-select process at each clock cycle. Even though the clock rate of the collapsed-trellis decoder may be reduced by using parallel circuits to collapse the trellis, numerous add-compare-select operations may still have to be performed, resulting in a long critical path. To counteract this, a highly parallelized structure is required in order to operate at high data rates. This of course increases the size, complexity and cost of the decoder and imposes an even greater decoding delay, which may be unacceptable. Even in a highly parallel structure, the duration of the critical path may be such that the decoder circuit is incapable of operating at very high signal processing rates.

Decoders as discussed above may be used in numerous applications. One such application is trellis-coded modulation, where a signal constellation is partitioned into subsets of signal points. The redundant bits of the convolutional codes are used to select the subset, and the uncoded bits are used to select the point within the subset. Viterbi decoding may then be used to determine the most likely sequence of signal subsets as part of the demodulation.

Another suitable use of the decoder is for channel equalization. In this application, the channel impulse response of a communication channel is modeled as a convolutional encoder that generates output "symbols" in response to the input bits. By estimating the impulse response of the channel, the expected output symbols of the convolutional coder (i.e., the channel) may be determined. Then, the received symbols, which are noisy estimates of the channel symbols, may be used to decode the symbol sequence using sequence estimation techniques such as the Viterbi algorithm. This is generally referred to as Viterbi equalization.

The decoder described herein may be used in any of the scenarios described above and in any scenario where the Viterbi algorithm or a variation of the algorithm may be employed. One such example is with typical prior art communications systems, such as the one shown in FIG. 2A. It consists of an optical transmitter 10 including an optical modulator 12 that converts the electrical data signal from pulse generator 14 into an optical signal 16 that is propagated through the optical fiber 20. At the receiving end, the optical signal from the fiber 20 is typically amplified by an optical amplifier 22, and the signal is then incident on an optical-to-electrical signal converter such as a photosensitive PIN diode 24. The output of the photodiode 24 is a weak current signal that is converted to a voltage signal and is amplified by the trans-impedance amplifier 26 (TIA). The clock-data recovery unit 28 (CDR) then recovers the clock information from the signal, samples it at the appropriate instance, and thresholds it to determine the transmitted data bits, which are provided at the binary data output 30.

A prior art CDR device is shown in FIG. 2B, and consists primarily of a clock recovery unit 50 and a sample and threshold unit 52. The clock recovery unit 50 determines the thresholding instance within a symbol period and the threshold unit 52 compares the signal value at that instance to a threshold value and resolves the transmitted bit to be a logical zero or one as a result of the comparison. The recovered clock may also be made available to other components via line 32.

The signal link from the transmitter to the receiver is not ideal, especially at high data rates; several impairments degrade the quality of the signal as it traverses the link. These impairments lead to erroneous decisions by the CDR 28 and hence increase the bit-error-rate (BER) of the link and can lead to link outages.

The sources of impairments in an optical link are many, and include linear effects, such as signal attenuation, reflections, and dispersion as well as nonlinear effects, such as self- and cross-phase modulation and four-wave mixing, among others. Optical amplifiers are employed at the transmitter and receiver ends as well as at intermediate points along the optical link to restore the loss of signal power. Several schemes are being proposed for dispersion compensation. These include employing dispersion compensation fibers (DCF) to mitigate the effect of chromatic dispersion and optical compensators to combat polarization mode dispersion.

These proposed schemes are difficult and expensive to implement, and may require manual adjustment or replacement of compensation fibers as the communication fiber or network link characteristics change over time. While Viterbi-type equalization may be used to provide improved performance, present implementations are not practical at high data rates due to the complexities associated with decoding.

Prior techniques of parallelizing aspects of the algorithmic processing have proven to be deficient in performance due to increased decoding delay or their inability to operate at sufficiently high speeds. Specifically, prior art implementations must perform an Add-Compare-Select operation at each clock cycle, thereby making the critical path too long to operate at high rates. Thus, there exists a need for improved decoding structures and methods to alleviate problems associated with high speed decoding.

SUMMARY OF THE INVENTION

A method and apparatus for data recovery is provided. In one embodiment, a high-speed maximum likelihood sequence estimation method is provided. The method includes identifying candidate paths through a state trellis based on a group of observed data, where each candidate path corresponds to a best path through a trellis beginning at one of a possible set of prior states (and corresponding prior data bit or bits), and then selecting one of the paths based on candidate sequence selection information, which is typically prior state decisions (e.g., data symbols in the form of one or more bits). The path selection, in turn, provides decoding of symbols and data bit information for use in selecting one of the candidate paths in a subsequent stage. Because the identification of candidate paths is independent of the prior state decision(s), the system advantageously performs much of the necessary path metric calculations or path selection before the decision(s) regarding the prior state(s) is available. Thus, the current state decision(s) may be made immediately once the prior state decision(s) are made available. Identification of candidate paths without consideration of prior state decision information and without obtaining initial cumulative path metrics, followed by selection of a single candidate path based on prior state information is referred to herein as delayed recursion.

In a preferred embodiment, cumulative path metrics at the first stage of each decoder are not used. Rather, the path metric at each state or group of states is assumed to be zero, and candidate paths are determined from each such possible prior state or group of states. Then, prior decisions are used (instead of cumulative prior path metrics) to select the appropriate candidate path. This method has the advantage of allowing the recursion step, where the state decisions are fed forward to the next stage and are used to identify the appropriate candidate path (and corresponding decision bits), to be performed at the very end of the process. The architecture of the preferred embodiment may be arbitrarily pipelined. The critical path is shortened as a result such that the method may be performed at a very high rate suitable for use in very high-speed communication systems such as 10 gigabit optical transceivers. The structures and methods described herein may be utilized in even higher rate communication systems when combined with hardware having increased parallelization and/or faster clock rates made possible by reduced integrated circuit feature sizes or improved fabrication technology.

More specifically, by delaying the recursion, the method is well suited for use in a parallel architecture. Thus, the method preferably operates in a parallel architecture whereby numerous stages operate simultaneously on a block of received data samples, where each stage identifies the best candidate paths through the state trellis. Once the candidate paths are identified, the current state decision outputs of each stage provide the next stage with the prior state decisions needed to select the best path from among the candidate paths for that stage. The first stage of the parallel architecture uses buffered state information or data outputs from the last stage of the prior cycle. In the parallel architecture, because the candidate path is selected based on prior decisions, the critical path typically consists of series-connected selectors (e.g., digital multiplexers), one for each parallel stage. In certain preferred embodiments, soft information may be utilized to assist in the selection of the preferred candidate path, in which case the critical path may be extended by the time it takes the soft information to propagate through the associated combinational logic gates in each stage.

A candidate path is identified for each initial state of the portion of the trellis under consideration (i.e., a block). That is, the methods and apparatuses described herein identify a candidate path for each initial state, or for each group of initial states for those embodiments where certain states are grouped together. Those of skill in the art will appreciate that the possible states of a given system may be characterized in more than one way. Thus, in one characterization, a state may be equivalent to a grouping of states in another characterization.

This process of path or sequence identification based on possible initial states differs from the Viterbi decoding process where the algorithm identifies surviving paths to each of the possible terminating states, which eventually eliminates paths from all but one initial state. More specifically, for Viterbi decoding, there is typically only one node at the earliest time frame at the end of the decoding window through which all surviving paths pass, thereby leading to a decoding decision corresponding to the surviving path (if more than one surviving path exists, then this is regarded as a decoding failure, and a suitable tie-breaking rule may be used—the rule may even be arbitrary). Another difference is that the Viterbi algorithm uses cumulative path metrics at the beginning of each path stage, whereas in the preferred embodiments the candidate paths are initially identified based on an assumption that all initial states are equally likely. More specifically, parallelized implementations of the Viterbi algorithm (and variations thereof) typically require a cumulative metric to be carried over from one stage of the parallel architecture to another, thereby increasing the critical path.

The method of identifying the best candidate path or sequence for each initial state may be done by extending paths forward through the trellis from time index to index. This may be performed using a well-known "add-compare-select" process of adding an incremental path error metric to the existing path metric, comparing the extended path metrics exiting a given node (not entering a given node, as is done in Vitberi), and selecting the smallest of the paths.

An alternative method and structure of identifying the best candidate paths may also be used. In this alternative embodiment, the candidate paths are examined in reverse order, beginning at the end nodes and traversing the trellis in time-reverse fashion. The term "time-reverse" simply refers to the fact that paths are determined by first considering later-received state observations. In particular, the process utilizes a "compare-select-add process" in that it first compares the incremental path metrics at the end of the block being considered, selects the smallest incremental error metric, and then adds the incremental errors from the prior stage for each path. The compare-select-add process is then repeated. As described more fully below, the reverse-order examination of paths results in computational efficiencies and efficient hardware structures used to identify a candidate path for each initial state. As will be seen, the efficiencies due to traversing the trellis in the reverse direction are made possible based on using criteria different from a traditional Viterbi algorithm. Again, the Viterbi algorithm identifies the best paths to each end node of a given trellis section. In the preferred embodiments described herein, the method and apparatus identify the best path starting at each originating state.

The method and apparatus may be used in a variety of configurations that vary the number of parallel path stages and their overlap (with respect to the portions of the trellis operated upon), the capture length of each path stage (i.e., the length of the candidate paths), the number of bit decisions output from each path stage, the number of bits used to identify the prior state decision (and to thereby select the candidate path), and the number of groups (and hence the number of candidate paths) within each path stage.

The method and apparatus described herein may be used to perform channel equalization, where a communication medium is viewed as a state machine and the transmitted data causes state transitions. The channel outputs are then decoded using a trellis decoding mechanism as described herein. That is, the channel equalizer recovers transmitted data in the presence of the effects of channel distortion by treating the channel itself as a convolutional encoder, which may be linear or nonlinear. Alternative embodiments may include using the devices and methods described herein as a trellis decoder for inverting the operation of a convolutional encoder at the transmitter.

BRIEF DESCRIPTION OF THE DRAWINGS

The objects, features and advantages of the present invention will be more readily appreciated upon reference to the following disclosure when considered in conjunction with the accompanying drawings, in which:

FIG. 3 is a block diagram of a clock and data recovery unit containing a preferred embodiment of a decoder used as an equalizer;

FIG. 4 is a block diagram of a preferred embodiment of an equalizer;

FIG. 5 is a flow chart of a preferred method of decoding;

DETAILED DESCRIPTION OF THE PREFERRED EMBODIMENT

Figure 1A:
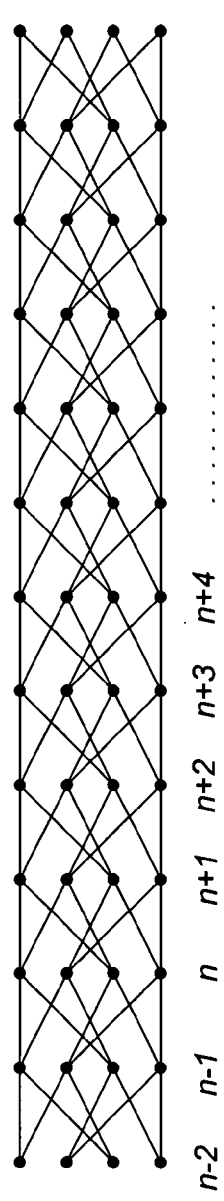
FIG. 1A depicts a prior art trellis code.

A preferred embodiment of the decoder is shown as part of a receiver architecture in the block diagram of FIG. 3. In addition to the clock recovery circuit 60 (typically a phase locked loop, or PLL) that recovers the clock information from the data signal, the decoder includes an analog-to-digital (A/D) converter 62 that obtains a digital representation of the TIA output or other data signal output device at the sampling instance specified by the clock recovery circuit 60. This digital signal is then processed by the decoder described herein, which acts as part of an equalizer 64 to determine the transmitted bit sequence. Note that the clock recovery circuit 60 and the A/D 62 form the analog components of the receiver and the equalizer 64 is the digital component. The performance of the decoder acting as an equalizer 64 as shown in FIG. 3 depends on the resolution of the A/D converter 62, the type of dispersive impairment, the algorithm employed, and the effectiveness of the clock recovery circuit 60 in determining the right sampling instance for the A/D converter 62.

The decoder described herein may operate at a rate high enough to make it suitable for use in optical receivers. The structure of the decoder when used as an equalizer 64 is illustrated in FIG. 4. The two components are the data-extraction unit 70 and the channel estimation unit 72. The channel estimation unit 72 estimates the characteristics of the channel by observing the channel output (A/D output) over a period of time. The data extraction unit 70 determines the transmitted data from the A/D output, using the channel estimation output from channel estimation unit 72.

The objective of the channel estimation unit 72 is to determine the channel output sample values corresponding to a sequence of input bits. This can be done using an LMS algorithm, as is well known in the art. Other techniques may also be used. One possible alternative channel estimator is to estimate each channel output independently as a moving average for each possible sequence of input bits. Each output may be separately accumulated, and the decoded bits may be used to determine which accumulator is updated with the observed channel output. This method is more general in that it does not assume any particular form to the linear or nonlinear characteristics of the channel. Note that because the channel is slowly varying, the channel estimator 72 does not have to operate at the same rate as the data extraction unit, which provides outputs at the data-rate. The channel estimation may be continually updated or may be periodically updated. The interval between updates depends on the time-varying nature of the communication system.

Let d(n) denote the current transmitted data symbol (which can be either a 0 or 1) and let r(n) denote the current channel output (output of the A/D converter). Due to inter-symbol interference (ISI), each received data sample r(n) is influenced by symbols preceding it as well as ones following it. In a preferred embodiment, the ISI is modeled as a linear combination of the current and the past two data symbols and their products taken two at a time to account for any nonlinear effects including that of the PIN diode or other receiver structures. Hence, the estimate of the channel output is expressed as:

$$\hat{r}(n) = w_0 d(n) + w_1 d(n-1) + w_2 d(n-2) + w_3 d(n)d(n-1) + w_4 d(n-1)d(n-2) + w_5 d(n-2)d(n)$$

where the $w_k$'s denote the channel weights, which depend on the type and the quantity of ISI. These weights are obtained dynamically by employing a channel estimation scheme based on the least mean squared (LMS) algorithm. Other channel models may be used, and modifications to the structure may be made to accommodate longer channel impulse responses, etc. as described herein. If the channel estimation is performed by simply averaging the actual symbols received as described above, then the symbol values are obtained directly from the accumulators.

As d(n) is binary, there are 8 possible values of $\hat{r}(n)$ for a given set of $w_k$'s. Let these be denoted as $\hat{r}_0 = \hat{r}(0,0,0) \ldots \hat{r}_7 = \hat{r}(1,1,1)$. In one embodiment, the deciser computes the mean squared estimation error over a sequence of four channel outputs r(n),r(n+1), r(n+2),r(n+3). Note that when the decoder is used as an equalizer, these outputs are a function of the six data symbols d(n−2), d(n−1), d(n),d(n+1), d(n+2),d(n+3). Of course, the capture length of the decoder (the number of outputs analyzed when determining candidate paths) is a design choice, and may be made arbitrarily long. As the capture length is increased, the candidate paths will tend to merge, and the performance will approach the performance of a Viterbi algorithm. One tradeoff with longer capture lengths is increased decoding delay since more symbols must be received prior to making a decision at a given time increment.

Assuming that d(n−2),d(n−1) are known, the algorithm determines which combination of the next four data symbols minimizes the mean squared error between the estimated and the received channel outputs r(n),r(n+1),r(n+2),r(n+3). As can be seen, this determination requires the feedback of the past decisions on d(n−2),d(n−1), which defines the initial state, or node of the trellis, from which the optimal path must begin. In the prior art, the number of calculations typically needed to determine the next decision after obtaining the previous decision (referred to as the "critical path") is quite large, thereby resulting in an architecture that may be un-implementable at high data rates. That is, computing the optimal paths only after the paths to the prior states are obtained results in a long critical path.

Therefore, in a preferred embodiment of the decoder, the critical path is reduced by pre-computing all possible sequence estimation errors conditioned upon the possible initial state values. As described above in terms of a binary signal transmitted through a given channel having an impulse response of three samples, the four observed channel outputs depend on six data symbols, including the first two data symbols which will in effect determine the initial state of the decoder. Consequently, the number of possible combinations for data symbols is sixty-four. That is, there are sixty-four possible paths through the trellis when the initial state (as determined by the first two data symbols) is unknown. These errors are denoted as $e_0(n) \ldots e_{63}(n)$.

In a preferred embodiment, the sixty-four errors are categorized into four groups of sixteen, where each one of them corresponds to one possible combination of the initial state given by d(n−2),d(n−1). The minimum error in each of the groups is computed first, as described more fully below. Finally, one of the four possible error values and the corresponding d(n),d(n+1) are chosen based on the feedback of d(n−2),d(n−1). Hence the feedback is delayed until the end, to keep the length of the critical path as small as possible.

In alternative embodiments, the sixty-four errors (or however many exist, depending on the other variables, such as number of possible symbols or states, capture length, the number of allowable state-to-state transitions, etc.) may be categorized into more or fewer groups. That is, the errors may be grouped into two groups, whereby two candidate paths would be determined, and a single feed-forward bit may be used to select the best candidate path. Alternatively, the errors may be grouped into eight groups, having eight candidate paths, and wherein three feed-forward bits would be used to identify the best candidate path.

In one preferred embodiment, the decoding method and decoding device operates on four input samples at a time and determines two data bits. Hence it is a two-parallel implementation resulting in a clock speed of $fd/2$, where $fd$ is the data rate of the underlying communication channel. For example, the clock speed of the circuit that provides the set of optimal paths to choose from based on the feedback would be 5 GHz when the data rate is 10 GB/s (Giga Bits per second).

The method and apparatus can be further parallelized in an alternative embodiment, such that for each set of four channel observations that are taken in, four data bits are determined. Each pair of bits are determined by a set of four channel observations, i.e. d(n),d(n+1) are determined based on r(n),r(n+1),r(n+2),r(n+3). The next two decisions, d(n+2),d(n+3) require r(n+2),r(n+3),r(n+4),r(n+5). Since these computations share 2 values of channel observations, then for each four channel observations that come in, four data values can be computed. Note that this involves simply delaying the most recent two channel observations by one stage, such that they comprise the most distant channel observations in the next stage. This process can then be further parallelized to produce eight output samples for each eight input channel observations.

One preferred method of decoding is described with reference to the method 100 in FIG. 5. At step 102, the block of symbols are received. In one embodiment of the decoder used for equalization, the symbols are four bit sample values from an A/D converter. In alternative embodiments where the decoder is used to decode symbols generated by a convolutional encoder at a transmitter, the symbols may be binary bits from a demodulator or receiver. The branch error metrics are computed in step 104 as given by $$e_{sk}(m) = (r(m) - \hat{r}_k)^2, \quad \text{Eq. 1}$$

for some set of m. In the preferred embodiment, m=n to n+7, and where n+6 and n+7 are also saved until the next cycle where they are made available as n−2 and n−1, respectively. These are the incremental branch error metrics for arriving at a state k at time m, when the received data or observed sample is r(m).

At step 106, the candidate paths are identified. This may involve computing all or a subset of sequence estimation errors $e_k$. The sequence estimation errors are given by:

$$e_k(n) = e_{s\lfloor k/8 \rfloor \bmod 8}(n) + e_{s\lfloor k/4 \rfloor \bmod 8}(n+1) + e_{s\lfloor k/2 \rfloor \bmod 8}(n+2) + e_{s\lfloor k \rfloor \bmod 8}(n+3), \quad \text{Eq. 2}$$

which may be re-written as:

$$e_k(n) = (r(n) - \hat{r}_{\lfloor k/8 \rfloor \bmod 8})^2 + (r(n+1) - \hat{r}_{\lfloor k/4 \rfloor \bmod 8})^2 + (r(n+2) - \hat{r}_{\lfloor k/2 \rfloor \bmod 8})^2 + (r(n+3) - \hat{r}_{\lfloor k \rfloor \bmod 8})^2, \quad \text{Eq. 3}$$

The sixty-four sequence estimation errors corresponding to the legitimate trellis paths or legitimate output sequences are denoted by the subscript k. Note that the index k is reduced as indicated by dividing and truncating modulo 8 in the calculation of the incremental branch error metrics of Equations 2 and 3. The sequence estimation errors $e_k$ are the path metrics for each permissible path through the trellis. The sequence estimation errors of the example embodiment are given below in Table 1. Note that the time index (e.g, n, n+1, etc.) of the incremental error terms is omitted in the individual rows of table 1, but follow the format as shown in row one of the table.

TABLE 1

| ek = esk/8(n + 1) + esk/4(n) + esk/2(n − 1) + esk(n − 2) |
| --- |
| e0 = es0 + es0 + es0 + es0 |
| e1 = es1 + es0 + es0 + es0 |
| e2 = es2 + es1 + es0 + es0 |
| e3 = es3 + es1 + es0 + es0 |
| e4 = es4 + es2 + es1 + es0 |
| e5 = es5 + es2 + es1 + es0 |

TABLE 1-continued

| ek = esk/8(n + 1) + esk/4(n) + esk/2(n − 1) + esk(n − 2) |
| --- |
| e6 = es6 + es3 + es1 + es0 |
| e7 = es7 + es3 + es1 + es0 |
| e8 = es0 + es4 + es2 + es1 |
| e9 = es1 + es4 + es2 + es1 |
| e10 = es2 + es5 + es2 + es1 |
| e11 = es3 + es5 + es2 + es1 |
| e12 = es4 + es6 + es3 + es1 |
| e13 = es5 + es6 + es3 + es1 |
| e14 = es6 + es7 + es3 + es1 |
| e15 = es7 + es7 + es3 + es1 |
| e16 = es0 + es0 + es4 + es2 |
| e17 = es1 + es0 + es4 + es2 |
| e18 = es2 + es1 + es4 + es2 |
| e19 = es3 + es1 + es4 + es2 |
| e20 = es4 + es2 + es5 + es2 |
| e21 = es5 + es2 + es5 + es2 |
| e22 = es6 + es3 + es5 + es2 |
| e23 = es7 + es3 + es5 + es2 |
| e24 = es0 + es4 + es6 + es3 |
| e25 = es1 + es4 + es6 + es3 |
| e26 = es2 + es5 + es6 + es3 |
| e27 = es3 + es5 + es6 + es3 |
| e28 = es4 + es6 + es7 + es3 |
| e29 = es5 + es6 + es7 + es3 |
| e30 = es6 + es7 + es7 + es3 |
| e31 = es7 + es7 + es7 + es3 |
| e32 = es0 + es0 + es0 + es4 |
| e33 = es1 + es0 + es0 + es4 |
| e34 = es2 + es1 + es0 + es4 |
| e35 = es3 + es1 + es0 + es4 |
| e36 = es4 + es2 + es1 + es4 |
| e37 = es5 + es2 + es1 + es4 |
| e38 = es6 + es3 + es1 + es4 |
| e39 = es7 + es3 + es1 + es4 |
| e40 = es0 + es4 + es2 + es5 |
| e41 = es1 + es4 + es2 + es5 |
| e42 = es2 + es5 + es2 + es5 |
| e43 = es3 + es5 + es2 + es5 |
| e44 = es4 + es6 + es3 + es5 |
| e45 = es5 + es6 + es3 + es5 |
| e46 = es6 + es7 + es3 + es5 |
| e47 = es7 + es7 + es3 + es5 |
| e48 = es0 + es0 + es4 + es6 |
| e49 = es1 + es0 + es4 + es6 |
| e50 = es2 + es1 + es4 + es6 |
| e51 = es3 + es1 + es4 + es6 |
| e52 = es4 + es2 + es5 + es6 |
| e53 = es5 + es2 + es5 + es6 |
| e54 = es6 + es3 + es5 + es6 |
| e55 = es7 + es3 + es5 + es6 |
| e56 = es0 + es4 + es6 + es7 |
| e57 = es1 + es4 + es6 + es7 |
| e58 = es2 + es5 + es6 + es7 |
| e59 = es3 + es5 + es6 + es7 |
| e60 = es4 + es6 + es7 + es7 |
| e61 = es5 + es6 + es7 + es7 |
| e62 = es6 + es7 + es7 + es7 |
| e63 = es7 + es7 + es7 + es7 |

Preferably, the allowable trellis paths or sequences are grouped according to each possible initial state (or, more generally, according to groups of possible prior states), and a minimum error path is chosen within each group to be a candidate path. Thus, a set of candidate paths is provided, each element of the set corresponding to a candidate path having the smallest error of all the paths originating from a given prior state or group of states.

At step 108, a single candidate path is identified based on prior decision information. The prior decision information from one or more prior stages is used to identify a group and its corresponding candidate path, which in turn has corresponding decision information which is fed forward to the next stage. Each candidate path has associated decision information because the selected trellis path, or equivalently, the selected sequence, can be used to determine the data inputs that generated the sequence. In one embodiment, a current bit-pair is selected based on a past data bit pair.

Figure 6:
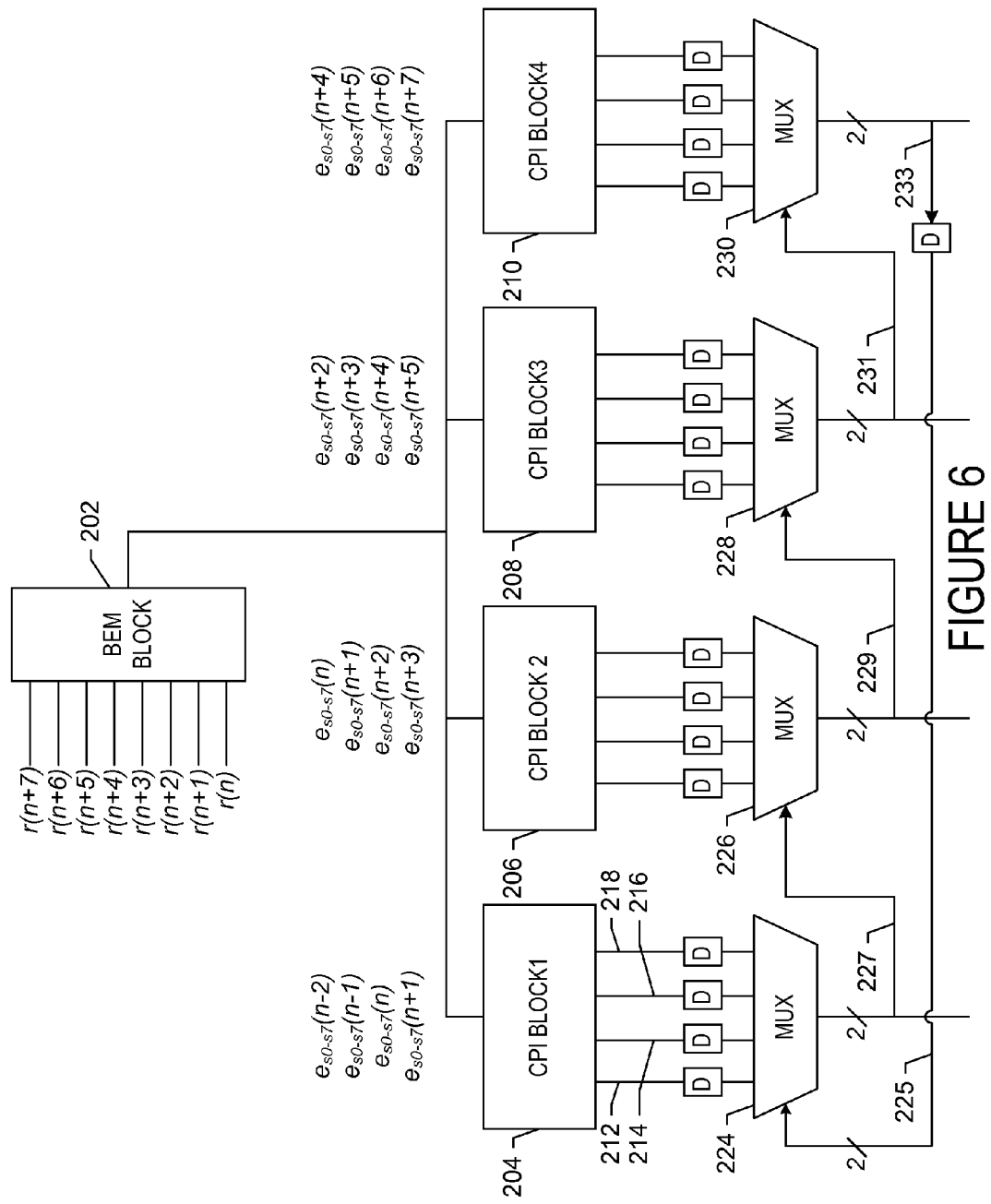
FIG. 6 is a more detailed block diagram of a preferred embodiment of an equalizer.

A preferred embodiment of an eight-sample decoder implementation is illustrated in FIG. 6. The preferred embodiment is described in view of the following assumptions: (i) the decoder is being used as an equalizer; (ii) the channel impulse response is a function of the current data bit, the data bit preceding it and the data bit that follows it; (iii) the data symbols are binary; (iv) four candidate paths are identified based on four possible initial states (as determined by the two initial data symbols); (v) the selection of a candidate path is used to decode two data bits at a time. Alternative embodiments will also be described that use variations of these operating parameters.

The eight-parallel implementation of FIG. 6 has a clock speed of $fd/8$. That is, it operates on eight input samples at a time to determine eight data symbols every clock period. The branch error metric block (BEM) 202 computes the individual branch error metrics denoted as $e_{sk}(m)$ in Equation 1, above. Note that there are eight channel observations input to BEM block 202 ($r(n)$ through $r(n+7)$), and for each channel observation there are only eight possible encoder values $\hat{r}_k$ to compare against, hence there are only a total of sixty-four branch metrics to be computed every clock cycle, as opposed to the 64×4 branch metrics that would be obtained directly if each CPI block separately calculated the branch error metrics. The operation of the BEM block 202 will be discussed in further detail below with reference to FIG. 7. The BEM block 202 performs step 104 of the method 100 described above.

The branch error metrics are then fed into the candidate path identification (CPI) blocks 204, 206, 208, and 210. The sequence estimation errors (the path metrics) are computed and a set of decision information associated with the candidate paths is provided on the outputs, which for CPI block 204 are labeled 212, 214, 216, and 218. In practice, the output decision information on lines 212–218 of this embodiment are two binary data bits corresponding to the candidate paths, but other methods and signals may be used to convey the state information. The four minimum sequence errors in each CPI block correspond to the four possible combinations of the past two output bits, i.e., the four possible initial states. Thus each candidate path is selected from a group of sixteen permissible trellis paths in this embodiment. The operation of the CPI blocks will be discussed in further detail below, with reference to FIG. 8. Each CPI block performs step 106 of the method 100 described above.

Each one of the CPI blocks 204, 206, 208, and 210 is used to determine candidate path selection information in the form of two bits in the following manner. Once the four pairs of bits from the four candidate paths are obtained, they are fed to a 4:1 (four-to-one) MUX as shown in FIG. 6. The MUX performs a selection such as might be done during a multiplexing operation. In particular, the MUX has a selection input that determines which of the inputs is connected to the output. The four bit pairs from CPI block 204 are fed to MUX 224, and those from CPI 206, 208 and 210 are fed to MUXs 226, 228, and 230, respectively. The MUXs 224, 226, 228, and 230 select the correct bit-pair based on candidate sequence selection information from the prior stage. Again, in the embodiment of FIG. 6, the candidate sequence selection information for each stage comprises the prior two bits received from the previous stages, as shown by connections 225, 227, 229, and 231. Note that output 233 of MUX 230 is latched and used as the prior data bits on line 225 for MUX 224 during the next clock cycle. The MUXs are used to perform step 108 of the method 100 described above.

The two structures discussed above, the BEM block and the CPI blocks, are feed-forward in nature and hence can be pipelined arbitrarily. Note that in FIG. 6, the outputs of CPI blocks 204, 206, 208, and 210 are latched to provide additional pipelining (i.e., the MUX operation is performed in the next clock cycle). Therefore, it can be seen from FIG. 6 that the critical path of the preferred decoder comprises just the four 4:1 MUXs.

Figure 7:
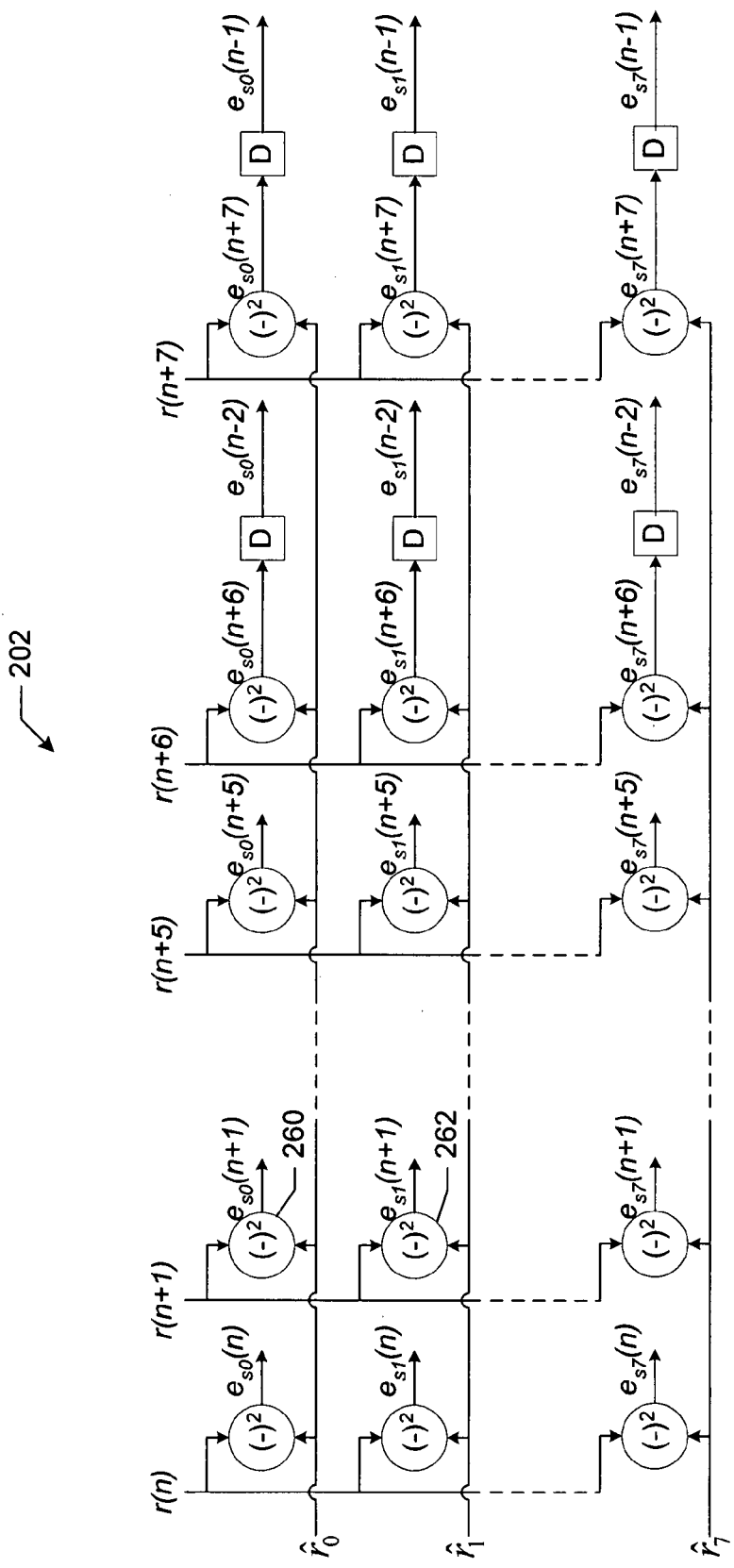
FIG. 7 is an embodiment of a branch error metric block.

The BEM block illustrated in FIG. 7 is one embodiment of a branch error metric block. This block uses sixty-four subtract-square units that operate in parallel to compute the sixty-four sample error estimates. The valid symbol values are provided at the left of FIG. 7, and are labeled $\hat{r}_0$ through $\hat{r}_7$. In an equalizer embodiment, channel estimation unit 72 provides these values. Depending on the implementation of channel estimation unit 72, the valid symbols may be provided directly from the running averages of the valid symbols, or may be computed from the estimated (possibly nonlinear) channel response together with the channel model. In other decoding applications, the valid symbols are typically determined based on the known characteristics of the encoder and its valid outputs.

The channel output samples, which are the actual channel observations from the A/D converter in the case of the decoder acting as an equalizer, are provided at the top and are labeled $r(n)$ through $r(n+7)$. They are preferably provided by a buffer that is loaded with the outputs from the A/D converter. In a preferred embodiment, the A/D converter outputs are in the form of four-bit unsigned data. The outputs of the BEM block are the sets of branch error metrics for each time increment. That is, for the channel output $r(m)$ at time m, the values $e_{sk}(m)$ are provided, where the subscript k corresponds to the valid symbol number with which it is being compared (the subscript s simply indicates it is a sample error metric, or branch metric).

Figure 8:
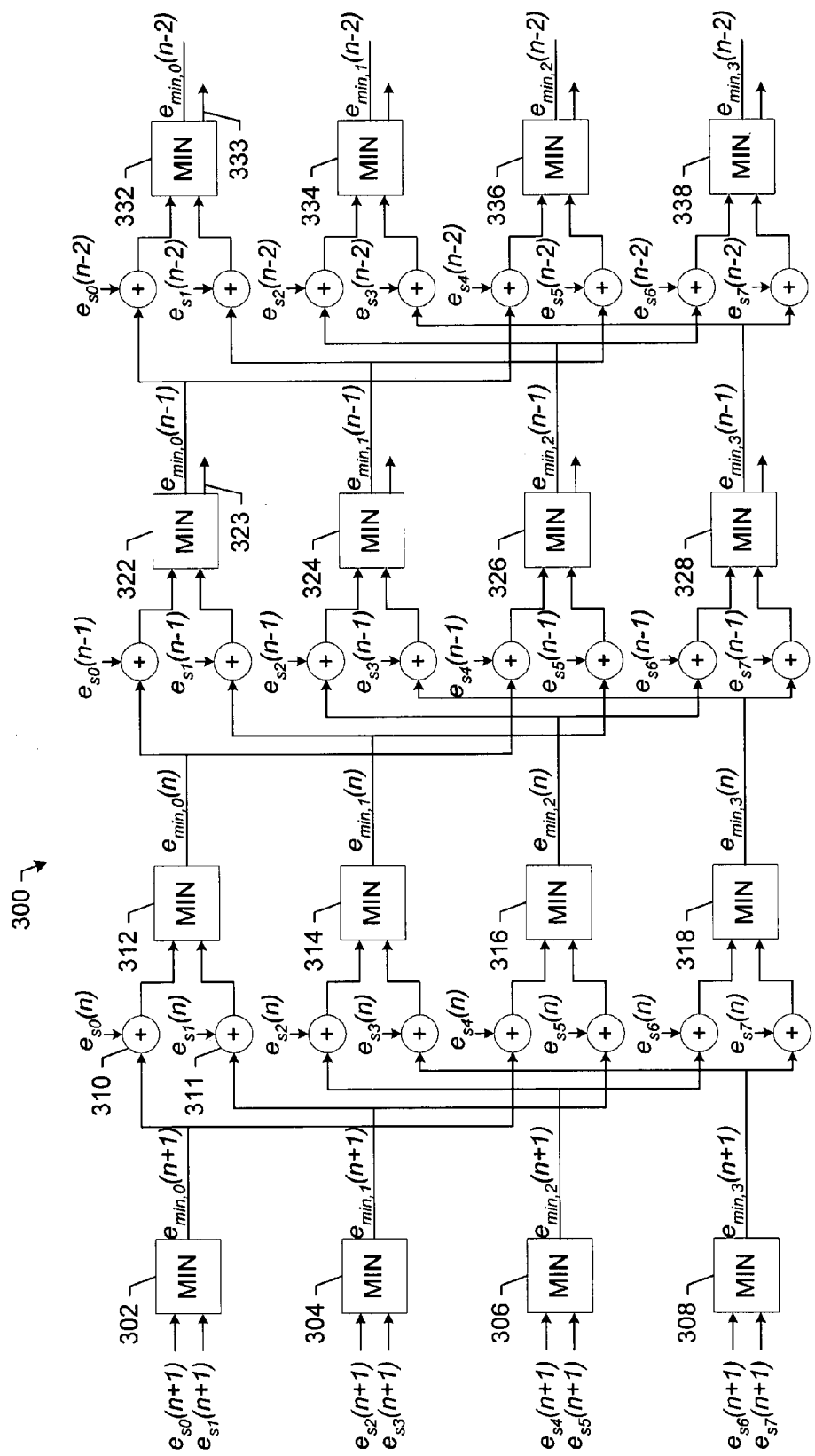
FIG. 8 is a block diagram of a candidate path identification block.

The CPI block is illustrated in FIG. 8. The interleaving of the "add" and the "min-select" operations significantly reduces the hardware overhead and results in a highly regular architecture. Note that the CPI block 300 shown in FIG. 8 operates first on the most recent observations first (denoted as $r(n+1)$ in FIG. 7). This is because numerous pairs of possible paths through the trellis differ only in the last (e.g., most recent) incremental error metric. Examining the paths by first considering and selecting paths based on later-in-time samples is referred to herein as time-reverse path selection or time-reverse trellis traversal. This can be seen easily in table 1, where the first two path metrics $e_0$ and $e_1$ differ only in the last error term $e_{s0}(n+1)$ versus $e_{s1}(n+1)$. In this case, the better path of the first two paths may be determined by examining only the last branch metrics, $e_{s0}(n+1)$ versus $e_{s1}(n+1)$. And significantly, a total of eight pairs of paths may also be distinguished based on the same comparison of $e_{s2}(n+1)$ versus $e_{s3}(n+1)$: $e_0$ and $e_1$, $e_8$ and $e_9$, $e_{16}$ and $e_{17}$, $e_{24}$ and $e_{25}$, $e_{32}$ and $e_{33}$, $e_{40}$ and $e_{41}$, $e_{48}$ and $e_{49}$, $e_{56}$ and $e_{57}$. Note that due to the time-reverse implementation, all of the possible path metrics need not be calculated, and in fact are not calculated. That is, numerous paths are eliminated by each set of min-selectors, as described below.

Comparison of table 1 with the first column of inputs to selectors 302, 304, 306 and 308 in FIG. 8 demonstrates that the first column of selectors eliminates half of the possible paths. Specifically, of the sixteen paths that differ only in the last branch, eight of them have been eliminated by each selector 302, 304, 306, and 308. Thus, the output of each selector 302-308 corresponds to a portion of a cumulative error metric that eight possible paths have in common, leaving a total of 32 possible paths after the first stage of selectors. The next column of selectors 312, 314, 316, 318 further reduces the paths by a factor of two. For example, selector 312 receives as inputs the outputs of selectors 302 and 304, after the branch error metrics $e_{s0}(n)$ and $e_{s1}(n)$ have been added by adders 310 and 311, respectively. As a result, the output of selector 312 effectively selects a set of four paths out of the possible eight, four of which are provided by selector 302 (the four best paths from the pairs $e_0$ and $e_1$, $e_{16}$ and $e_{17}$, $e_{32}$ and $e_{33}$, $e_{48}$ and $e_{49}$), and the four provided by selector 304 (the four best from the pairs $e_2$ and $e_3$, $e_{18}$ and $e_{19}$, $e_{34}$ and $e_{35}$, $e_{50}$ and $e_{51}$). Specifically, the portion of the cumulative error metric from selector 312 is common to four possible remaining paths, which are the best of each of the four sets (where the notation $e_0/e_1$ means the prior stage selection between $e_0$ and $e_1$): ($e_0/e_1$, $e_2/e_3$), ($e_{16}/e_{17}$, $e_{18}/e_{19}$), ($e_{32}/e_{33}$, $e_{34}/e_{35}$), ($e_{48}/e_{49}$, $e_{50}/e_{51}$). Further examination of FIG. 8 and table 1 demonstrate that each successive stage of selectors reduces the possible paths by a factor of two. That is, outputs from selectors 322, 324, 326, 328 each correspond to the cumulative error metrics for two possible best paths, and the outputs of selectors 332, 334, 336, and 338 each provide the cumulative error metric for a single candidate path.

The MIN blocks in the last two columns provide decision outputs (for example, 323 and 333) corresponding to the selections made by MIN blocks 322 and 332, respectively. The two outputs are combined and provided on CPI output 212 (a 2 bit bus) (see FIG. 6) as the decision information. The outputs 214, 216 and 218 are similarly formed from the MIN block pairs (324, 334), (326, 336), and (328, 338), respectively. The decision information is then available for use as candidate path selection information for the next stage.

In an alternative embodiment, the trellis path metric calculation may be performed in the forward direction to identify candidate paths in each CPI. Note that even if the trellis is traversed in the forward direction, subsequent CPI blocks do not need to obtain results from a previous CPI block prior to identifying candidate paths, unlike typical Viterbi algorithms. This is because each CPI block independently analyzes a portion of the trellis, and does not require information about prior trellis paths or decisions until the very end, after candidate paths have been identified. Note also that there is no requirement that candidate paths have different terminal states. This is because the candidate paths are preferably selected from all possible paths from a given initial state, and the selection is based on cumulative error metrics. Therefore, it is possible, even likely, that the candidate paths may share one or more intermediate nodes or have the same terminal nodes in the trellis.

Figure 9:
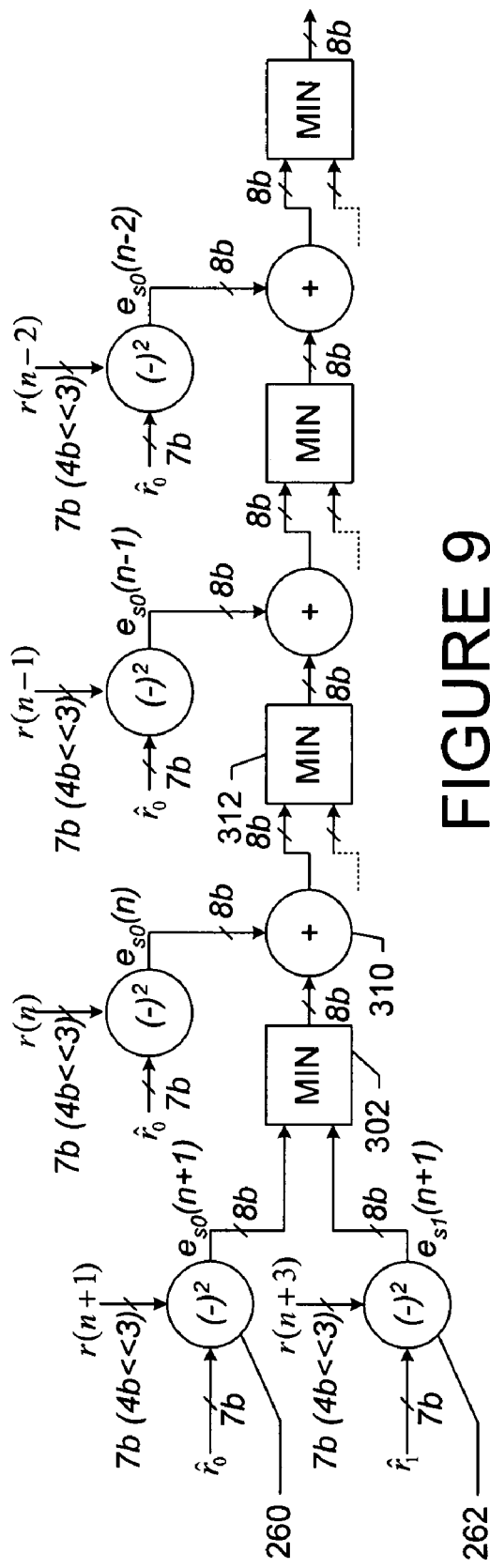
FIG. 9 is block diagram of preferred embodiment of a portion of a candidate path identification block.

The VLSI implementation of the decoder may be performed with different mathematical precision. A high-precision implementation results in a performance that is close to that with floating-point, but the hardware overhead increases compared to a lower-precision architecture. A preferred architecture is described having an eight-bit precision. This architecture is shown in FIG. 9, which depicts portions of the BEM block 202 and a CPI block 204 (as indicated by the first stage selector operating on $e_{s0}(n+1)$ and $e_{s1}(n+1)$). The A/D output is assumed to be 4-bit unsigned. This choice was made based on both algorithmic performance and process limitations. The circuit first computes the branch error metrics in the BEM block 202. This involves a subtract-and-square operation by units 260, 262 within BEM block 202. The subtract-and-square operation is carried out in two phases. In the first phase the circuit performs the subtract-absolute operation. This uses an adder having an output that is seven-bits wide. The observed data sample from the four-bit A/D is left shifted by 3 bits to obtain a seven bit sample, as indicated in FIG. 9 by the notation: 7b(4b<<3). The circuit then performs the square operation with just the five leftmost bits to obtain a ten-bit result, the top eight of which are used. This results in an eight-bit wide result as shown in FIG. 9.

The output of the BEM block 202 then feeds into the CPI blocks. In the CPI block, initially a min-select operation (selection of the minimum) is performed in MIN block 302 and the output is the least of the two inputs. This operation considers only the eight leftmost bits of the operands. This eight-bit output is then added in adder 310 to the next output from the BEM block 202 to result in an eight-bit output. With this architecture, additional stages may be added by simply repeating the min-select and squaring circuits.

Figure 10A:
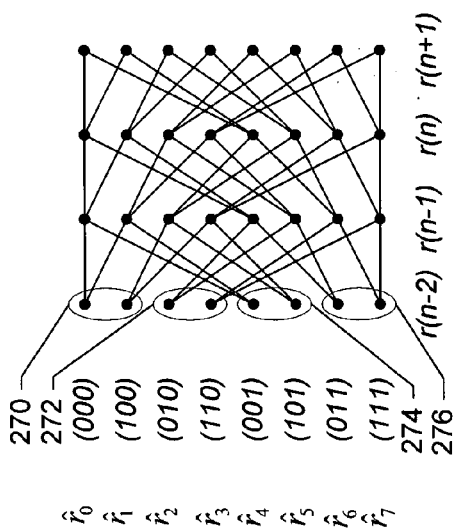
FIGS. 10A and 10B are trellis diagrams associated with preferred decoder embodiments.

FIG. 10A depicts a trellis diagram for the above-described preferred embodiment, where binary signaling is sent over a communication path having a "memory" of three symbols. The trellis depicts the possible states and state transitions for four time intervals. The sixty-four possible paths are grouped by initial states as shown by ovals 270, 272, 274, and 276. The candidate path outputs of the CPI blocks provide the best path originating from each group of initial states. That is, selector 332 from FIG. 8 will provide the best path originating from states 000 and 100, selector 334 will provide the best path originating from states 010 and 110, etc.

Figure 10B:
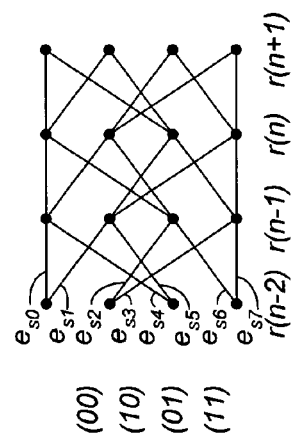

Note that the trellis of FIG. 10A contains some redundant information. That is, the state diagram may be fully represented by four states representing the two bits of channel memory, with the latest input bit determining the transition to the next state. FIG. 10B shows a simplified trellis for the same channel model. Also shown in FIG. 10B are the incremental errors, or branch error metrics, $e_{s0}$ through $e_{s7}$ for time n−2, which represent the metrics for the transition from states at time n−2 to time n−1.

Figure 11A:
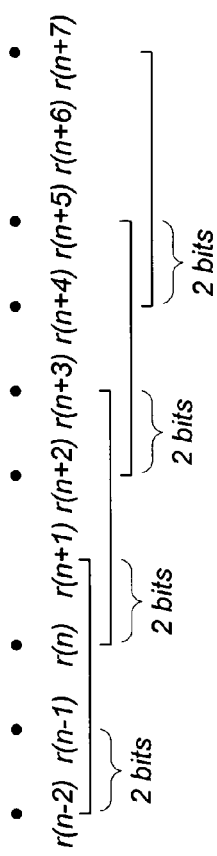
FIGS. 11A, 11B, and 11C are diagrams depicting the grouping of observations.

FIG. 11A depicts a timeline showing which channel observations are grouped together, and how they overlap, for the four CPI blocks of the preferred embodiment of FIG. 6. Specifically, CPI block 204 operates on received samples r(n−2) through r(n+1), CPI block 206 operates on received samples r(n) through r(n+3), CPI block 208 operates on received samples r(n+2) through r(n+5), and CPI block 210 operates on received samples r(n+4) through r(n+7).

Other embodiments exist that may be used to accommodate variations to the above assumptions. For example, a larger coding constraint length n (or a longer channel impulse response in the case of a Viterbi equalizer) may be used, in which case there would be more initial states to consider (typically $2^{n-1}$ states, or groups). This would increase the number of paths to consider when identifying the candidate paths for each state or group. Since each path would extend through more time frames of the trellis, this embodiment uses more channel observations and the calculation of more incremental branch error metrics. The CPI architecture of FIG. 8 is easily extended through the addition of more adders and min-select blocks.

Similarly, a larger symbol set may be used (commonly referred to as m-ary signaling, with a symbol set of m symbols instead of binary signaling). This would also have the effect of increasing the number of initial states to consider (typically $m^{n-1}$ states, or groups), and would thus also increase the number of paths to consider when identifying the candidate path for each initial state or group. However, the number of channel observations used (i.e., the length of the candidate paths) would not necessarily change. In this embodiment, the CPI architecture is modified to accommodate the calculation of the path metrics, such as modifying the min-select blocks to select the minimum of three, four or more inputs.

Figure 11B:
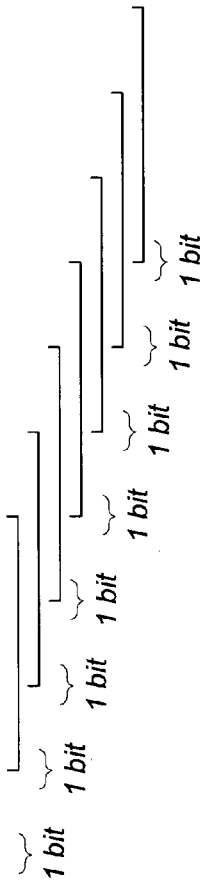
Figure 12:
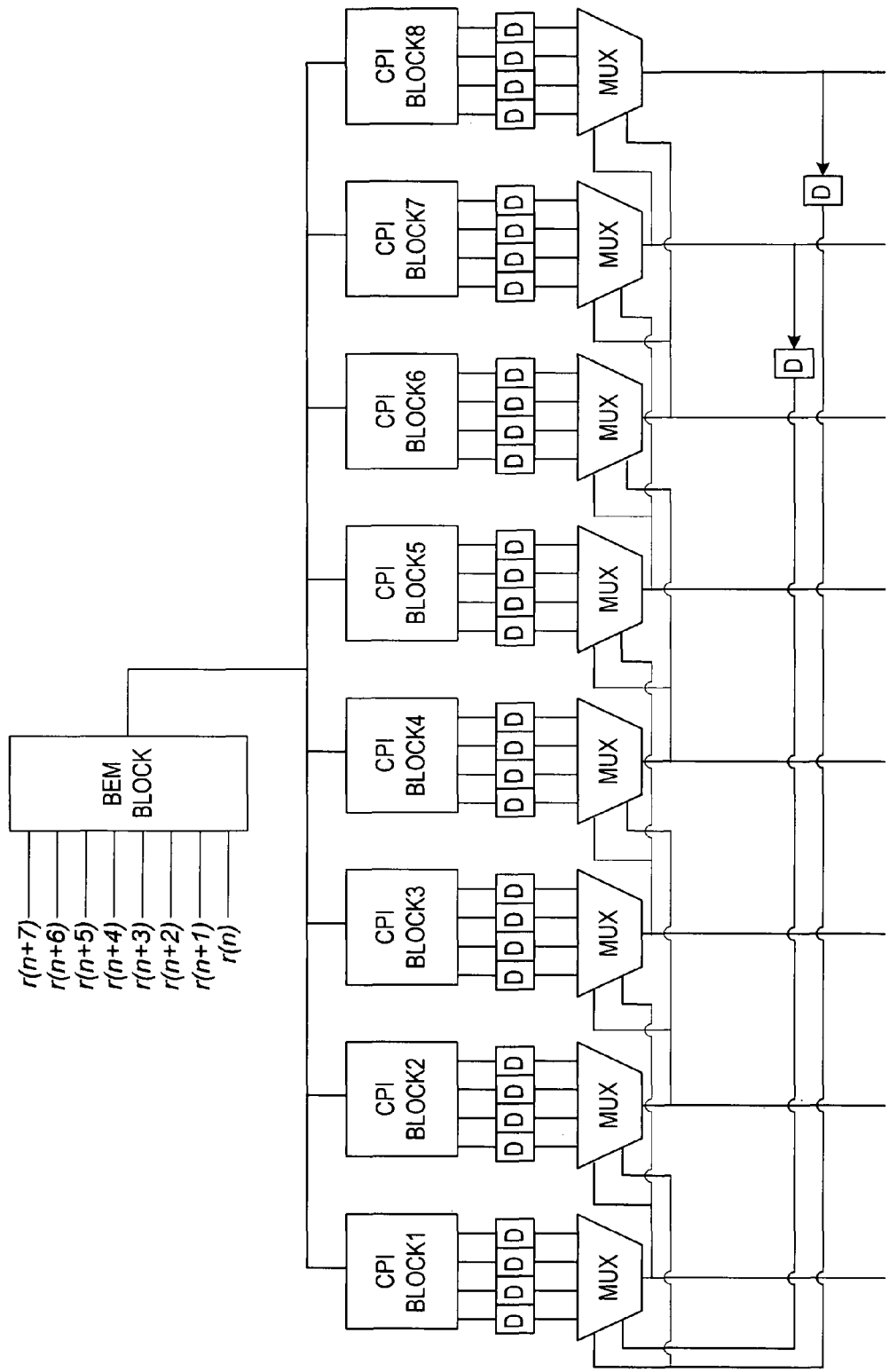
FIG. 12 is an alternative preferred embodiment of an equalizer.

In a further embodiment, each candidate path may be used to provide only a single bit decision. In this embodiment, the sets of observations used are modified as shown in FIG. 11B. In this embodiment, eight CPI blocks would be required, and would be interconnected as shown in FIG. 12.

Figure 11C:
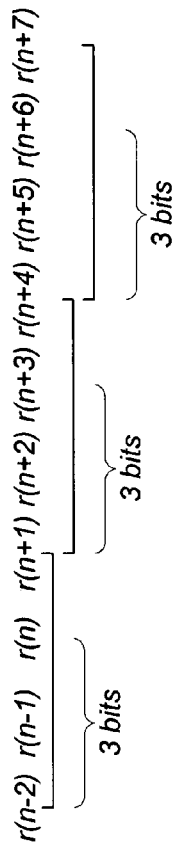

In yet a further alternative embodiment, each candidate path may be used to select more than two bits, such as three as shown in FIG. 11C. Even more may be decided from a single CPI block, depending on the other parameters and the desired error performance.

Figure 13:
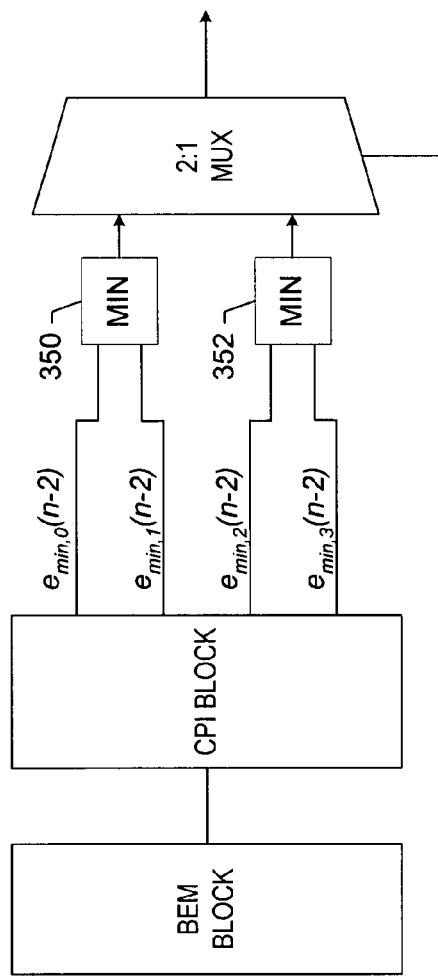
FIG. 13 is an alternative embodiment of a candidate path identification block providing two candidate paths; and, FIG. 14 is an alternative embodiment of a candidate path identification block in combination with a selector for use with soft information.

In the embodiment shown in FIG. 13, the paths are grouped into only two groups, and the candidate paths are narrowed to two choices by the addition of another selector stage with minimum selectors 350 and 352.

In general, alternative preferred embodiments may be configured such that the number of symbols used to feed forward to the next stage (the candidate path or sequence selection information) need not be the same as the number of actual decisions used as outputs from a given stage. Specifically, FIG. 12 depicts an embodiment where the number of actual output decisions provided by a stage is 1. The outputs of two stages are then combined in FIG. 12 to select one of four candidate sequences in the next stage. In a reverse situation, each stage divides the paths into only two groups, thus requiring only one input bit to select the candidate path. Nevertheless, each stage may provide two output bits from the selected candidate path, but only one of them is fed forward to select the path from two possible candidates. The number of decision outputs provided impacts the required overlap of the stages, as shown in FIG. 11, not necessarily the number of groups (i.e., the number of candidate paths).

Thus, if the communication system is using M-ary signaling, and the channel response (or channel memory or coding memory) has length of L, then there are $M^L$ possible symbols. The path length P of each CPI block is preferably no less than L, but may be longer than L. In fact, P might be equal to L+D−1, where D is the number of symbol decisions from each stage. N is the number of output symbols fed forward from each stage to the next, which could be greater than, less than, or equal to D. Then the relationship between the number of groups G (i.e., candidate paths) and M, N, and P is: $G=M^N$, where N can be anywhere between 1 and P. Finally, the spacing of the overlap of one stage to the next is independent of N, and is set by D. In the preferred embodiment of FIG. 4, M=2, N=2, G=4.

In another embodiment, the CPI blocks in an equalizer decoder may provide candidate sequence selection outputs containing soft information. That is, the CPI blocks may provide selection information in the form of hard bits, as previously described, or may provide soft information, such as a measure of the probability that the decision is correct, or both. Because each CPI block computes a path metric, in one embodiment this soft information may be provided along with the decision bits for use in any further soft decoding in a later decoding process. In particular, decoding algorithms have been developed that use soft information to improve the performance of coding techniques, such as Reed-Solomon decoders.

In addition, the CPI blocks described above may be modified to generate soft information and to make use of the soft information that is fed forward from a prior stage. In particular, each CPI block may provide soft decision information to the next CPI block in the form of an additional bit (or bits) indicating that the "hard" decision bit (or bits) is likely correct or incorrect. If the soft information bit indicates the hard decision bit or bits are likely correct, then it may be used to select the group, candidate path, and corresponding decision information. On the other hand, if the soft decision information indicates the accuracy of the hard decision bits is unreliable, then the CPI block may simply elect the candidate path from among all candidate paths having the smallest cumulative path metric, essentially ignoring the prior state information fed forward from the previous stage. Similarly, if only some of the hard decision bits are unreliable, then the reliable ones can be used to limit the number of potential groups, and the CPI may select the minimum candidate path (and associated output decision information) from the remaining groups.

Figure 14:
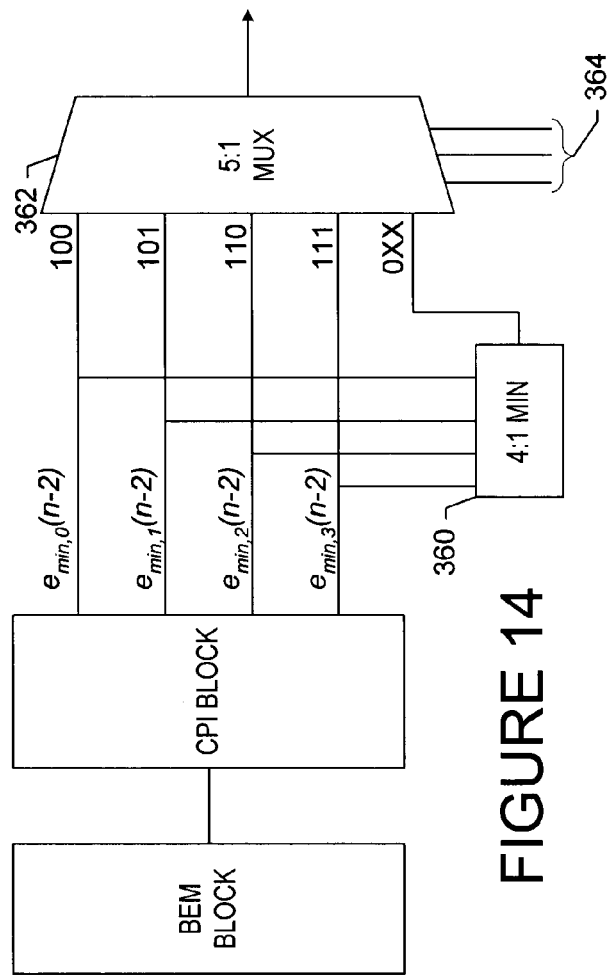

Preferably, in embodiments using soft decision information, the soft decision outputs are calculated in hardware by each stage and are fed forward simultaneously with the decision information being used to select a candidate path in the next stage. Similarly, each stage preferably determines not only the set of candidate paths, but also a preferred candidate path to be used in the event that the prior state information is determined to be unreliable. This is done with 4-input min-select 360. The min-select then provides the decision information associated with the preferred candidate path to the additional input to the 5:1 MUX 362 in each stage. Thus, in addition to the candidate paths, the MUX may select the best or preferred candidate path if the soft information indicates the prior state information is unreliable. In FIG. 14, the first bit of the candidate selection information 364 is the soft information bit. As indicated on the inputs to the MUX 362, if the soft bit is a logic 0, then the preferred candidate path is selected without regard to the prior state information (where the XX indicates a "don't care" condition). In this embodiment, the critical path is not lengthened by the use of soft decision inputs to the MUX candidate path selector.

The determination of whether the bit is "correct" may be made in a number of ways: for example, one way is to compare the error metric to a threshold. The threshold level may be an absolute reference or may be determined by other error metrics for the other groups within the CPI block. In one embodiment, for example, soft information may be generated as follows: a superior candidate path may be defined as a candidate path from among the set of candidate paths whose cumulative path metric is less than all other candidate path metrics by a predetermined amount (by a threshold difference, or a ratio, etc.); if such a superior candidate path exists, but that path is not selected as indicated by the candidate path selection input from the prior stage, then the soft information bit output may be set low to indicate a possible error. In all other cases of this embodiment, the soft information bit is set high. Note that conditioning the generation of the soft information on the prior state decisions (i.e., the candidate sequence selection information received from the prior stage) does not increase the critical path. Specifically, the detection and identity of the superior candidate path may be pipelined such that it can be ready and immediately checked against incoming prior state information via a simple logic circuit. One such circuit comprises two exclusive NOR gates to compare the prior state information with the state information associated with the superior path. The outputs of these gates can then be combined in a NAND gate that indicates a mismatch. That output can be combined in an AND gate with a signal indicative of the presence of a superior path. In addition, note that the logic circuit operates in parallel with the MUX that provides the hard decision outputs. Thus the soft bit is generated after a few gate delays, and the hard bits are generated after a single MUX delay. Other techniques of generating and using soft information may result in an increase in critical path times, and their suitability may be determined based on the timing constraints of the particular application.

Figure 1B:
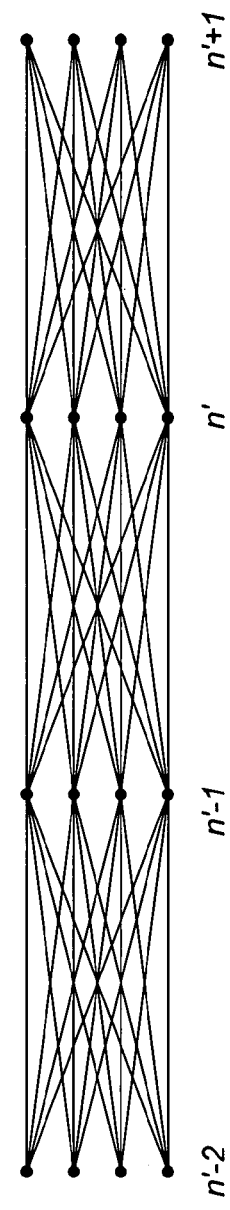
FIG. 1B depicts a prior art method of collapsing trellis nodes into a collapsed trellis.
Figures 2A, 2B:
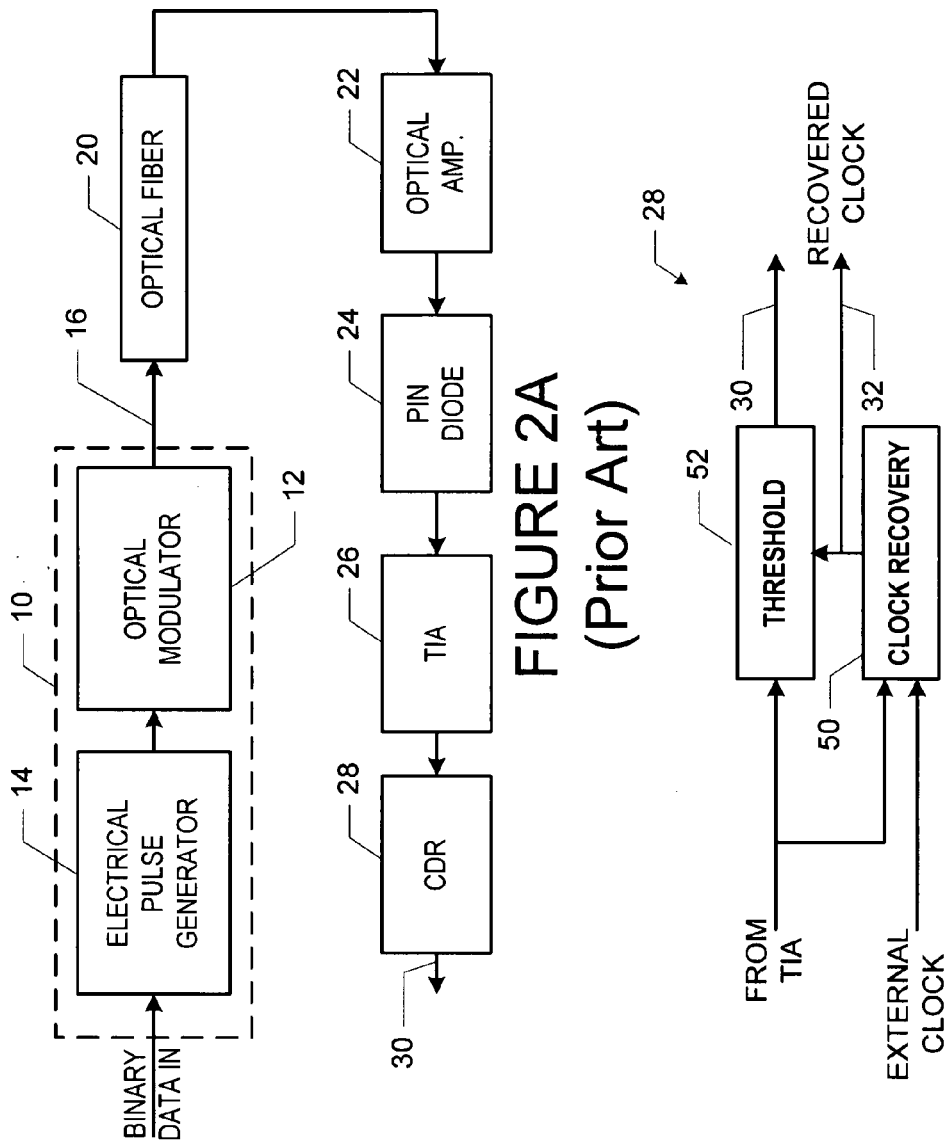
FIGS. 2A and 2B are block diagrams of a prior art communication system and associated clock and data recovery device.

In a further alternative embodiment, the decoder described above may operate on a collapsed trellis generated according to the prior art techniques described with respect to FIG. 1B. Specifically, the BEM block may be replaced by the prior art techniques of combining N state transitions into a single transition interval. The metrics may then be used to traverse the collapsed trellis (in the forward or reverse directions, as described above) to identify the candidate paths through the collapsed trellis.

The CPI blocks are again modified to provide min-select blocks that can accommodate a greater number of inputs, since collapsing the trellis has the effect of increasing the number of possible state transitions from state to state.

Thus, in an embodiment having a CPI block path length of four collapsed transitions, the selection of a candidate path may actually provide 2N decision bits. Note that only the final two bits need be fed forward to the next stage for candidate path selection.

The receiver architecture described herein is particularly useful for high-speed optical receiver integrated circuits (ICs) for next-generation optical metro area networks (MAN), long-haul (LH), and Ultra long-haul (ULH) networks (OC192 and beyond). The device incorporates signal processing techniques, architectures and circuitry operational at optical data rates. The introduction of signal processing elements results in dramatically increased tolerance to optical signal dispersion and distortion as compared to conventional clock-data-recovery (CDR) optical receiver ICs.

One benefit associated with the devices described herein is the reduction of network outages for carriers and network providers and to increase the performance of existing optical links. In addition, next generation networks may be deployed with dramatically lower cost.

The devices and methods described herein relate to an equalization-enhanced receiver IC presently operating at 10 Giga Bits per second (GB/s) that performs clock and data recovery in the presence of severe distortion caused by, e.g., dispersion, both chromatic and polarization mode (PMD), fiber non-linearities such as four-wave mixing (FWM) and other system non-idealities such as spectral variance of the transmitter, and other effects of employing low-cost optical components.

In particular, the devices and methods described herein may be used to upgrade lower performance ("dark links") to OC-192. The device's ability to provide PMD compensation capability of >100 ps, optical long-haul links containing older fiber (PMD >0.5 ps/$\sqrt{k}$) can be upgraded from 2.5 Gb/s to 10 Gb/s in a cost effective fashion.

A preferred embodiment of the present invention has been described herein. It is to be understood, of course, that changes and modifications may be made in the embodiment without departing from the true scope of the present invention, as defined by the appended claims. The present embodiment preferably includes logic to implement the described methods in software modules as a set of computer executable software instructions. The Computer Processing Unit ("CPU") or microprocessor implements the logic that controls the operation of the system. The microprocessor executes software that can be programmed by those of skill in the art to provide the described functionality.

The software can be represented as a sequence of binary bits maintained on a computer readable medium including magnetic disks, optical disks, and any other volatile or (e.g., Random Access memory ("RAM")) non-volatile firmware (e.g., Read Only Memory ("ROM")) storage system readable by the CPU. The memory locations where data bits are maintained also include physical locations that have particular electrical, magnetic, optical, or organic properties corresponding to the stored data bits. The software instructions are executed as data bits by the CPU with a memory system causing a transformation of the electrical signal representation, and the maintenance of data bits at memory locations in the memory system to thereby reconfigure or otherwise alter the unit's operation. The executable software code may implement, for example, the methods as described above.

It should be understood that the programs, processes, methods and apparatus described herein are not related or limited to any particular type of computer or network apparatus (hard-ware or software), unless indicated otherwise. Various types of general purpose or specialized computer apparatus may be used with or perform operations in accordance with the teachings described herein. The system may utilize wireless communication systems, and involve portable handheld devices.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

It should be understood that a hardware embodiment might take a variety of different forms. The hardware may be implemented as an integrated circuit with custom gate arrays or an application specific integrated circuit ("ASIC"). Of course, the embodiment may also be implemented with discrete hardware components and circuitry.

The claims should not be read as limited to the described order of elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

We claim:

1. A method for estimating a sequence of symbols, wherein the symbols conform to predetermined valid symbol sequences, comprising the steps:

forming at least two predetermined groups of valid sequences, wherein each group is formed based on possible initial states and includes all possible valid sequences originating from the respective initial states;

receiving a set of symbol measurements;

identifying a candidate sequence for each group of valid sequences, wherein the candidate sequence is a valid sequence from its respective group that is closest to the set of symbol measurements, wherein each candidate sequence has corresponding decision information, and wherein each candidate sequence is identified by forming a set of error metrics for each symbol in the set of received symbols, and using the sets of error metrics to select sequences in time-reverse order; and determining at least one output decision by selecting a group and corresponding decision information from the identified candidate sequence in response to candidate sequence selection information.

2. The method of claim 1 wherein the candidate sequence selection information is fed forward from a prior output decision.

3. The method of claim 1 wherein the recited steps are performed in each one of a plurality of parallel stages, and wherein the at least one output decision of each stage is provided to at least one other stage as at least a portion of the candidate sequence selection information.

4. The method of claim 3 wherein the respective sets of received symbols for the plurality of stages are overlapping.

5. The method of claim 1 wherein the groups are formed according to possible initial states, and where each group corresponds to a single state.

6. The method of claim 1 wherein the groups are formed according to possible initial states, and where each group corresponds to a plurality of initial states.

7. The method of claim 1 wherein the step of determining at least one output decision is performed in response to soft information.

8. A method for estimating a sequence of symbols, comprising the steps:
    forming groups of paths through a trellis based on the initial states of the paths;
    forming sets of sequential samples of symbols, wherein the sets comprise at least a first set of samples and a next set of samples;
    for each set of samples, determining a plurality of minimum error paths and corresponding candidate decision information, wherein each group has a minimum error path and corresponding candidate decision information;
    selecting a group corresponding to the first set of samples and its minimum error path and its corresponding decision information, where the selection is based on prior state information; and
    using at least a portion of the selected corresponding decision information to select a group corresponding to the next set of samples and its corresponding decision information.

9. The method of claim 8 wherein a portion of the sequential samples in the first set of sequential samples are repeated in a portion of the sequential samples in the next set of sequential samples.

10. The method of claim 8 wherein each group corresponds to a single possible prior state.

11. The method of claim 8 wherein each group corresponds to a plurality of possible prior states.

12. A decoder comprising:
    at least one sequence error estimator comprising an input to receive symbol error metrics and a plurality of candidate path outputs and a plurality of interconnected selectors and adders, wherein said at least one sequence error estimator identifies a plurality of candidate paths in time reverse order and decision information corresponding to each of said candidate paths, and provides said decision information at said candidate path outputs; and,
    a selector connected to said at least one sequence error estimator, said selector having inputs connected to said candidate path outputs, a selector output for providing an output decision, and a selection input for determining which of said inputs is interconnected to said selector output, thereby providing an output decision corresponding to the decision information on said interconnected input.

13. The decoder of claim 12 wherein said at least one sequence error estimator comprises a plurality of sequence error estimators, and wherein at least a portion of the output decision of a first of said plurality of sequence error estimators is provided to said selection input of another of said plurality of sequence error estimators.

14. A decoder device comprising:
    a branch error metric block for generating incremental error estimates;
    a plurality of candidate path identification blocks, each of said candidate path identification blocks providing a set of outputs; and,
    a plurality of selection devices, wherein each one of said plurality of selection devices is connected to said set of outputs of each one of said plurality of candidate path identification blocks, where each selection device provides data outputs, and wherein the data outputs of each of said plurality of selection devices is used to select the data outputs of another of said plurality of selection devices.

15. A decoder device comprising:
    means for generating branch error metric values;
    at least one decoding means connected to said means for generating branch error metrics, wherein each decoding means comprises:
    a sequence identification means for identifying a set of candidate sequences in response to said branch error metrics, wherein each candidate sequence within said set of candidate sequences has associated candidate decision information; and
    a selecting means for receiving said associated candidate decision information, and for providing output decision information, said output decision information being generated in response to said associated candidate decision information, and output decision information from a selecting means of another decoding means.

16. The decoder of claim 15 wherein said selecting means uses said output decision information from a selecting means of another decoding means to select candidate decision information from one of said candidate sequences.

17. The decoder of claim 15 wherein said sequence identification means computes candidate sequences by operating in a time reverse order.

18. The decoder of claim 15 wherein said sequence identification means comprises a plurality of mm-select means.

19. The decoder of claim 15 wherein said selecting means is a multiplexer.

20. The decoder of claim 15 wherein said output decision information includes candidate decision information from one candidate sequence within said set of candidate sequences.

21. The decoder of claim 15 wherein said output decision information includes soft decision information.

22. The decoder of claim 15 wherein said at least one decoding means comprises a first and a last decoding means, and wherein said output decision information of said last decoding means is buffered for a first time frame and then provided to said last decoding means in another time frame.

23. A method of recovering information from a plurality of state observations of system comprising the steps:
- identifying a candidate sequence for each initial state of a system having a plurality of initial states, wherein the candidate sequence for each initial state is identified in time-reverse order, and wherein each candidate sequence has an associated candidate set of decision information;
- receiving initial state decision information; and
- selecting a single candidate set of decision information from the candidate sets in response to the received initial state information.

24. The method of claim 23 wherein the candidate set of decision information comprises at least one data bit decision.

25. The method of claim 24 wherein the candidate set of decision information further comprises soft decision information.

26. The method of claim 25 wherein the soft decision information comprises a measure of reliability of the at least one data bit decision.

27. The method of claim 23 wherein the step of identifying a candidate sequence for each initial state comprises the steps of:
- computing branch error metrics;
- computing and comparing path metrics; and
- identifying a path having the smallest path metric for each initial state.

* * * * *